(12) United States Patent  (10) Patent No.: US 8,493,734 B2
Chien et al.  (45) Date of Patent: Jul. 23, 2013

(54) MULTI-CASE RACK FOR INDUSTRIAL COMPUTER

(75) Inventors: Chih-Yung Chien, Taoyuan Hsien (TW); Sophia Chen, Taoyuan Hsien (TW)

(73) Assignee: T-Win Systems, Inc., Taoyuan (TW)

( * ) Notice: Subject to any disclaimer, the term of this patent is extended or adjusted under 35 U.S.C. 154(b) by 378 days.

(21) Appl. No.: 13/078,043

(22) Filed: Apr. 1, 2011

(65) Prior Publication Data

US 2012/0250247 A1  Oct. 4, 2012

(51) Int. Cl.
*H05K 7/20* (2006.01)
*H05K 5/00* (2006.01)
*H05K 5/06* (2006.01)

(52) U.S. Cl.
USPC ............... 361/695; 361/679.34; 361/679.48; 361/727; 361/679.02; 454/184; 174/15.1; 174/547; 174/50.52; 211/26

(58) Field of Classification Search
USPC ..... 361/679.01–727; 165/80.2; 257/712–713, 257/721; 174/15.1, 16.1, 547, 50, 52; 454/184
See application file for complete search history.

(56) References Cited

U.S. PATENT DOCUMENTS

| 5,785,533 | A | * | 7/1998 | Baitz et al. | 439/61 |
| 6,330,139 | B1 | * | 12/2001 | Liao | 361/86 |
| 6,437,980 | B1 | * | 8/2002 | Casebolt | 361/679.54 |
| 6,958,906 | B2 | * | 10/2005 | Wu et al. | 361/679.5 |
| 7,589,974 | B2 | * | 9/2009 | Grady et al. | 361/735 |
| 7,894,195 | B2 | * | 2/2011 | Lin | 361/727 |
| 7,952,864 | B2 | * | 5/2011 | Wang et al. | 361/679.33 |
| 8,305,748 | B2 | * | 11/2012 | Wang et al. | 361/679.32 |

* cited by examiner

*Primary Examiner* — Zachary M Pape
(74) *Attorney, Agent, or Firm* — Jackson IPG PLLC

(57) ABSTRACT

A multi-case rack for an industrial computer includes a rack body and a plurality of removable cases. The removable case can be installed with either its axial end positioned ahead, thus compatible to both a front circuit board and a rear circuit board. The removable case has an anti-shock HD mount capable of holding either two 2.5" hard drives or one 3.5" hard drive. The removable case allows heat-dissipating fans to be installed and positioned in a screw-free, hot-swap manner. The removable cases can be readily installed into or from a rack body.

3 Claims, 5 Drawing Sheets

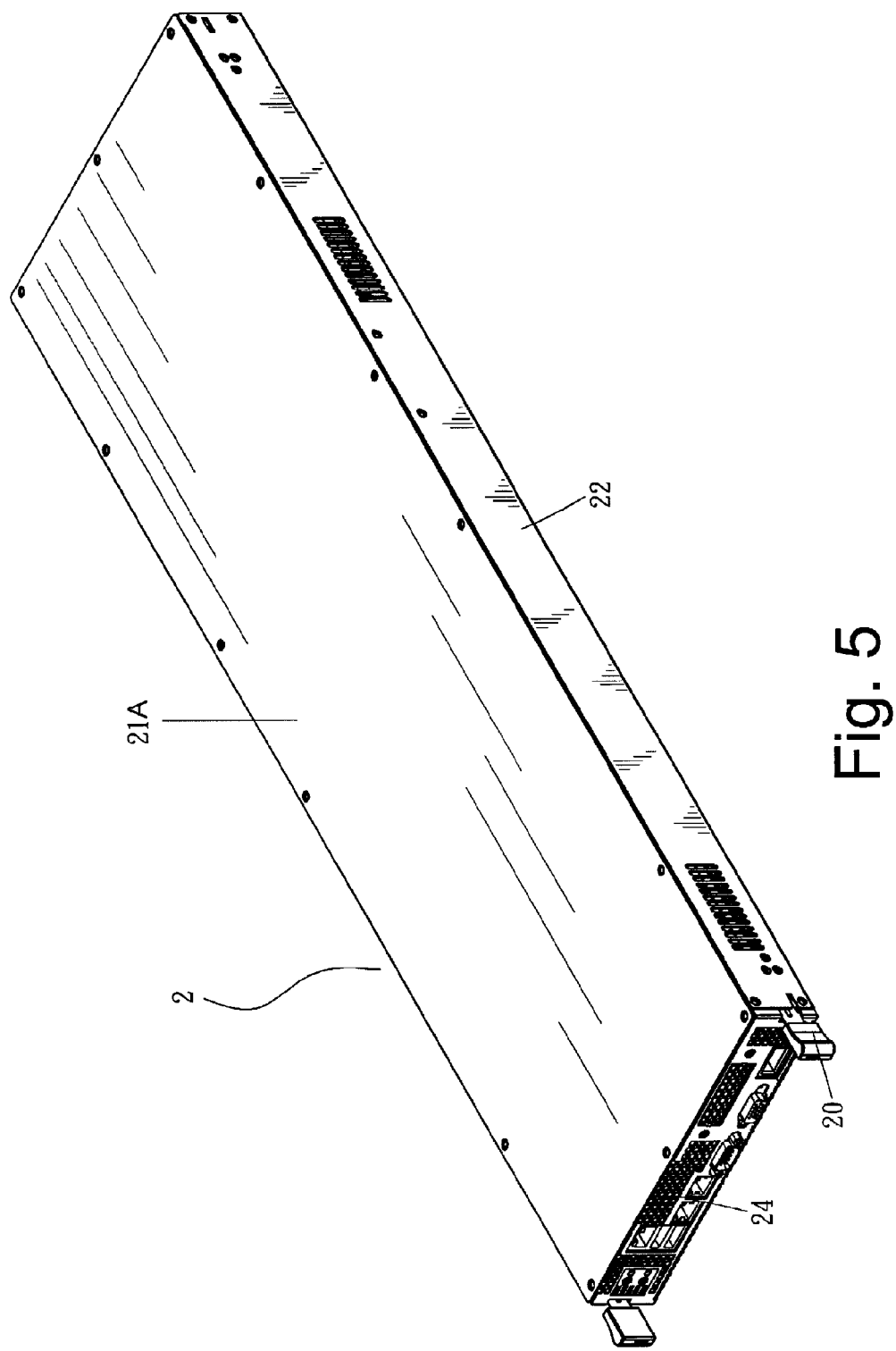

MULTI-CASE RACK FOR INDUSTRIAL COMPUTER

BACKGROUND OF THE INVENTION

1. Technical Field

The present invention relates to a multi-case rack for an industrial computer, which is composed of a rack body and a plurality of removable cases. The multi-case rack is characterized in being compatible to both a front circuit board and a rear circuit board, having heat-dissipating fans that support functions of screw-free installation and hot swap, and accommodating either two 2.5" HD or one 3.5" HD.

2. Description of Related Art

Industrial computers are popular for high-speed operation, high storage capacity and sustained performance. An industrial computer typically combines plural normalized units (1U) each built in a highly normalized case. In use, the industrial computer has two or more removable cases (2) stacked in height in a rack body (1) to form a 2U, 3U, 4U or 5U industrial computer. The removable case (2) usually carries a motherboard, a power supply, an HD (hard drive) and a heat-dissipating fan [CD-ROM drive], among others.

Conventionally, removable cases (2) are made with different configurations for receiving motherboards in front and rear portions thereof, respectively. For allowing a motherboard to be installed in a front portion thereof, the removable case (2) must have a power input end and a signal output end provided on its front plate. On the contrary, a removable case (2) to receive a motherboard at its rear portion has to make its power input end and signal output end provided on its back plate. The removable cases (2) thus come in either said configuration for buyers' option.

Hence, manufactures traditionally have to make and stock the removable cases (2) of the two configurations separately for meeting buyers' needs in both a front-motherboard and rear-motherboard applications. Consequently, the manufactures suffer from doubled manufacturing costs, processes, mold-building expenses and storage costs for semi-products and products as compared with those for each of the configurations.

In addition, the removable case (2) typically has therein a hard drive for storing data. While hard drives are commercially provided in specifications of 2.5" and 3.5", a conventional removable case (2) is made with a fastening mechanism suitable for only one of the HD specifications. In other words, for hard drives of different specifications, different removable cases have to be prepared.

Furthermore, a removable case (2) is usually equipped with a plurality of heat-dissipating fans arranged abreast for dissipating heat generated by such components installed in the removable case (2) as a motherboard (M/B) carrying a CPU and an extension holder, a power supply and hard drives. While the heat-dissipating fans have been developed to support hot-swap installation, it is currently necessary to fix the fans with bolts for proper positioning, being also an inconvenience related to the conventional device.

SUMMARY OF THE INVENTION

In view that the traditional removable case (2) as described previously is unadaptable for different locations of motherboards, inconvenient because the heat-dissipating fans have to be positioned with bolts and unadaptable for different HD sizes, the present invention herein proposes solutions.

The present invention provides a multi-case rack for an industrial computer. Therein each removable case and a rack body's front and back plates are formed with notches for engaging with elastic fasteners, so that the removable case may be installed with either its axial end (i.e. front end or rear end) positioned ahead, thus compatible to both a front circuit board and a rear circuit board. The removable case also implements an anti-shock HD mount that can receive either two 2.5" hard drives or one 3.5" hard drive. The removable case additionally allows heat-dissipating fans to be installed and positioned in a screw-free, hot-swap manner through a single operation. Plural said removable cases can be readily installed into or from a rack body.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein:

FIG. 5 is a schematic drawing showing the removable case in a position for providing a rear motherboard.

DETAILED DESCRIPTION OF THE INVENTION

Figure 1:
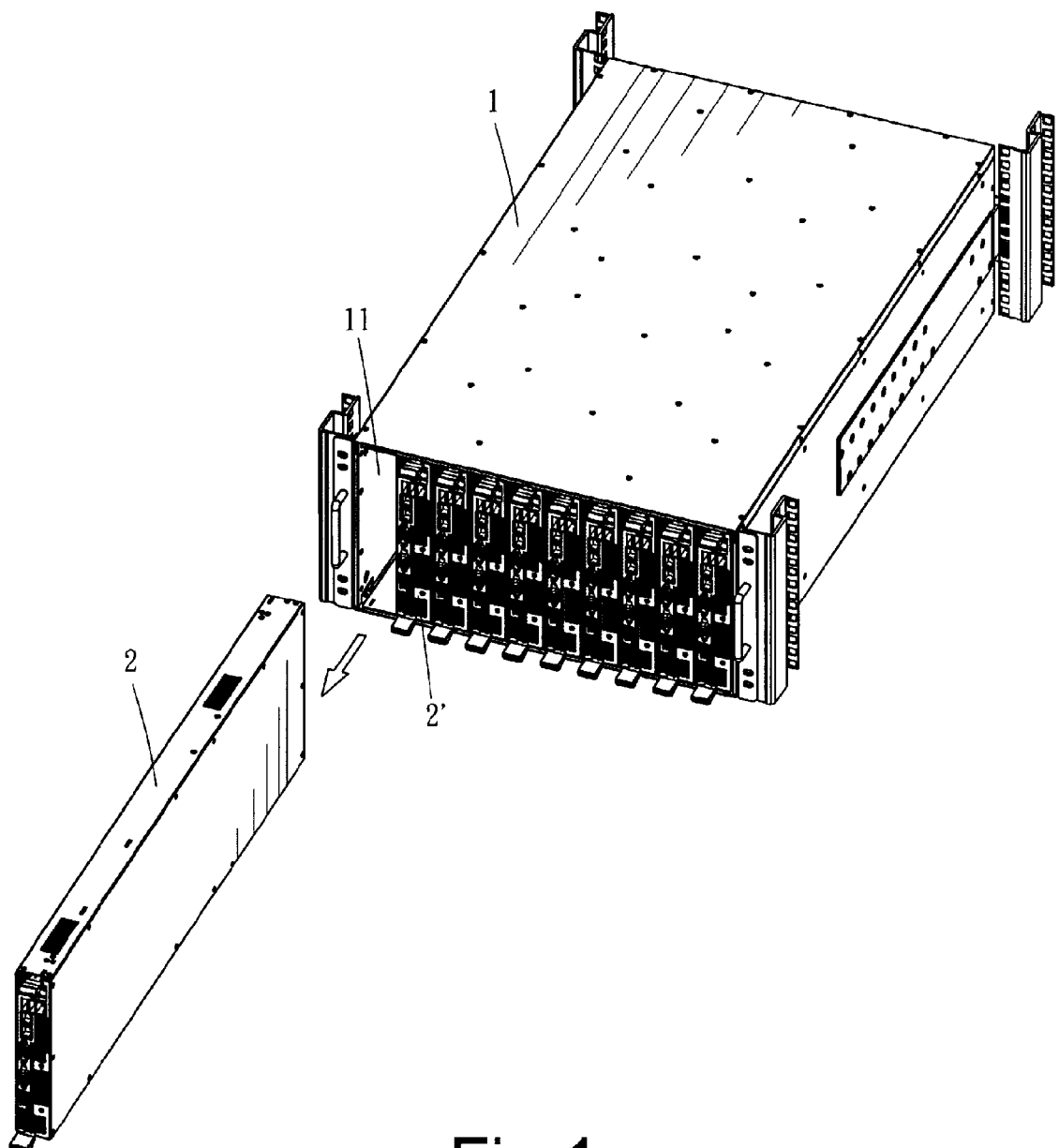
FIG. 1 is a perspective view of one embodiment of the present invention.

Referring to FIG. 1, the present invention provides a multi-case rack for industrial computer, which primarily composed of a rack body (1) and a plurality of removable cases (2), (2').

Referring to FIG. 1, the rack body (1) has a plurality of sockets (11) for each receiving one said removable case (2).

Figure 2:
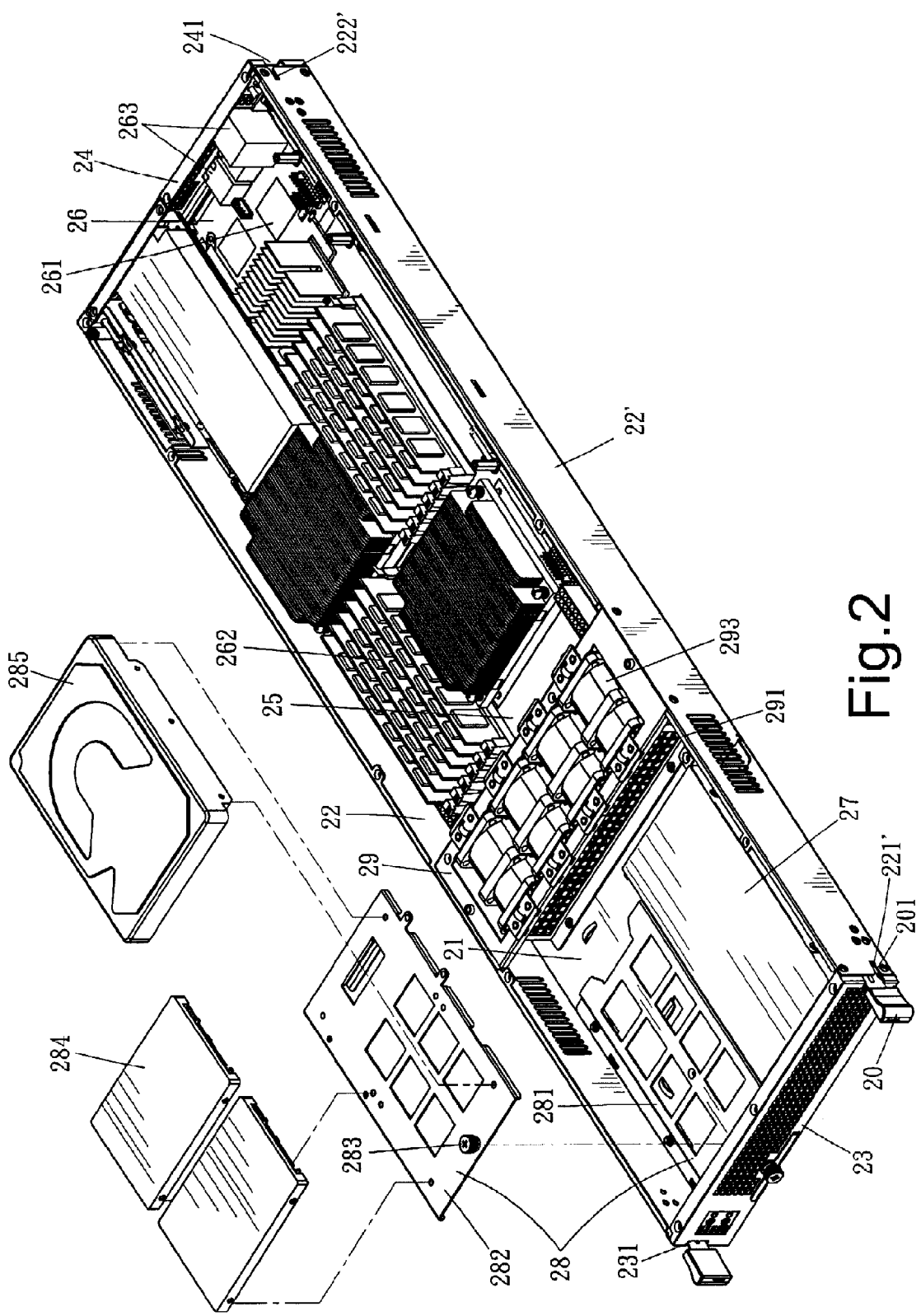
FIG. 2 shows a removable case of the present invention with its upper plate removed, wherein the removable case receives a front motherboard.
Figure 3:
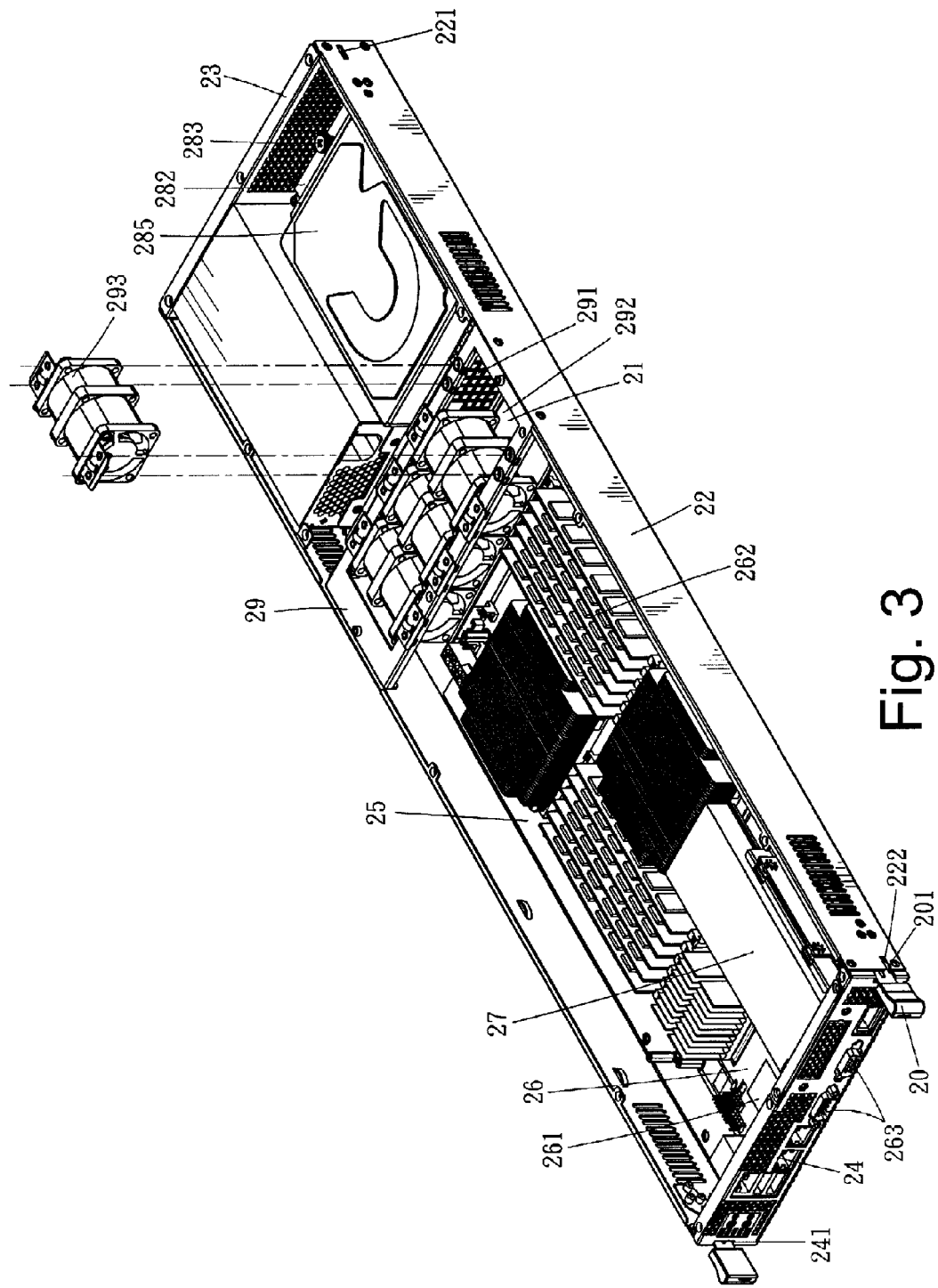
FIG. 3 shows a removable case of the present invention with its upper plate removed, wherein the removable case receives a rear motherboard.

Referring to FIG. 2 and FIG. 3, each said removable case (2) is constructed from a lower plate (21), an upper plate (21A), two symmetrical lateral plates (22), (22'), a front plate (23) and a back plate (24) so as to define therein an accommodating space (25).

In the accommodating space (25) of the removable case (2), a motherboard (26), a power supply (27), an anti-shock HD mount (28) and a fan seat (29) are set, among others. As known, the motherboard (26) carries a CPU (261), an extension holder (262) and I/O terminals (263).

The lateral plates (22), (22') of the removable case (2) are formed with slots (221), (222), (221'), (222') near their axial ends (i.e. front and rear ends), while the front plate (23) and the back plate (24) have symmetrically arranged notches (231), (241). Elastic fasteners (20) in pairs are used to engage with the slots (221), (221') or (222), (222') at the front or rear end of the lateral plates (22), (22') and to engage with the notches (231) or (241) on the front plate (23) or back plate (24), such that the elastic fasteners (20) have their retaining ends (201) extending outward from the slots (221), (221') or (222), (222'), allowing a motherboard (26) to be installed as a front or rear motherboard in the removable case (2), namely to be installed in a front portion or rear portion of the removable case (2).

As described above, referring to FIG. 1, the removable case (2) receiving the motherboard (26) can be removably installed into the socket (11) of the rack body (1).

Referring to FIG. 2, the anti-shock HD mount (28) is composed of a shock-absorbing base (281) and a positioning board (282). The shock-absorbing base (281) is located in the accommodating space (25) and fixed to the lower plate (21) of the removable case (2). The positioning board (282) may be positioned on the shock-absorbing base (281) with a bolt (283). The positioning board (282) is capable of holding either two 2.5" HDs (284) or one 3.5" HD (385).

Figure 4:
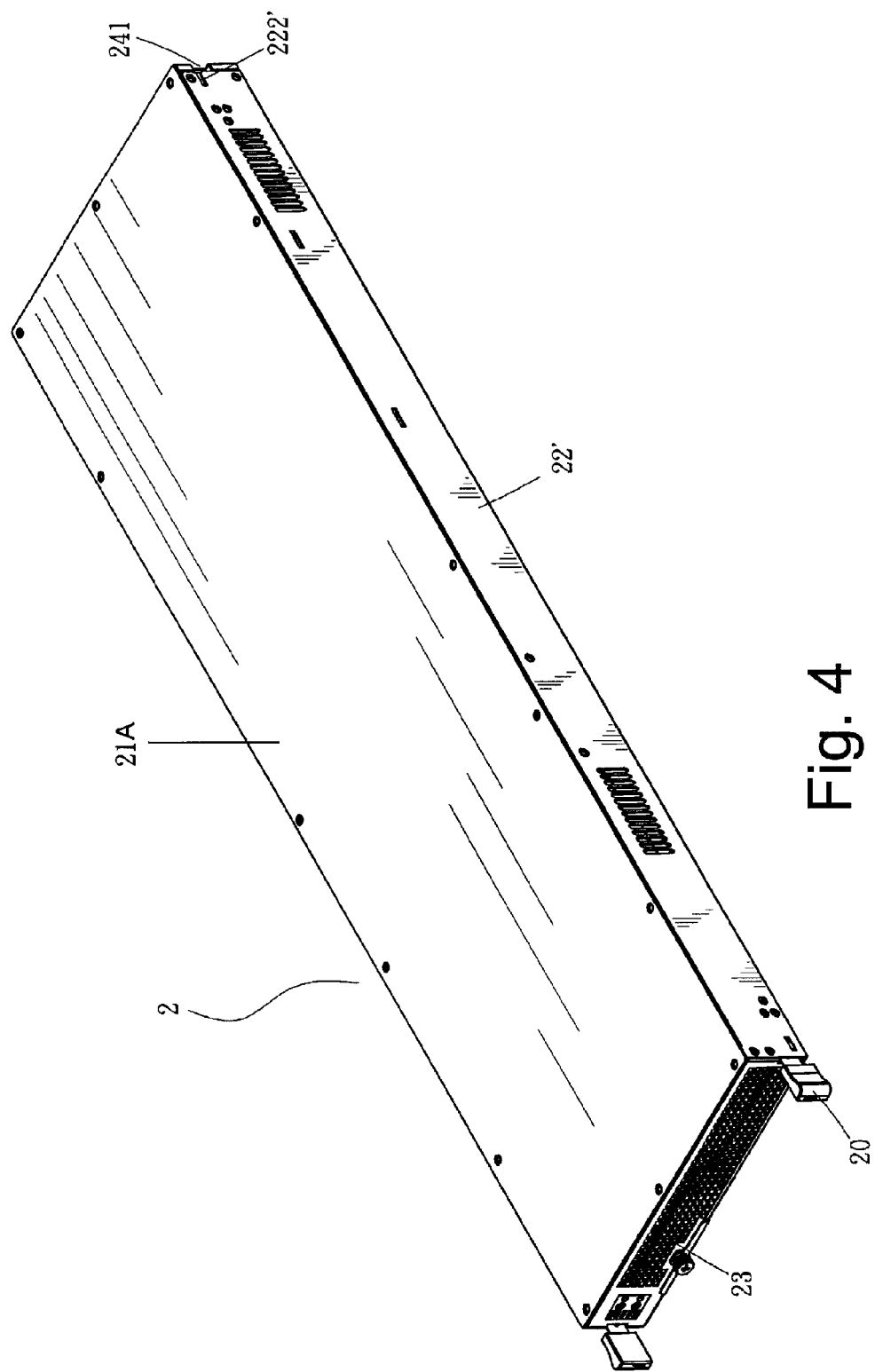
FIG. 4 is a schematic drawing showing the removable case in a position for providing a front motherboard.

Referring to FIG. 3, the fan seat (29) is a frame crossing over the lateral plates (22), (22') with one downward extending surface formed with air vents (291). The fan seat (29) is open upward and exposes a plurality of holes (292) for receiving a plurality of heat-dissipating fans (293), respectively, in the manner that the heat-dissipating fans (293) having their tops leveled with an upper edge of the anti-shock HD mount (28). After the heat-dissipating fans (293) are installed, the upper plate (21A) can be assembled to fix the heat-dissipating fans (293) in position, as shown in FIG. 3 and FIG. 4.

Thus, the removable case (2) of the present invention can receive a circuit board in its front or rear portion as needed, and can hold either two 2.5" HDs (284) or one 3.5" HD (385), while the heat-dissipating fans (293) can be easily installed in a screw-free, hot-swap manner.

What is claimed is:

1. A multi-case rack for an industrial computer, the multi-case rack comprising:
   a rack body (1) having a plurality of sockets (11) for each receiving a removable case (2);
   a plurality of said removable cases (2), (2'), each said removable case (2) having a lower plate (21), an upper plate (21A), two symmetrical lateral plates (22), (22'), a front plate (23) and a back plate (24) so as to define an accommodating space (25) therein, the lateral plates (22), (22') being formed with slots (221), (222), (221'), (222') near front and rear ends thereof, and the front plate (23) and the back plate (24) being formed with symmetrical arranged notches (231), (241);
   an anti-shock HD mount (28) being composed of a shock-absorbing base (281) and a positioning board (282), the shock-absorbing base (281) being located in the accommodating space (25) and fixed to the lower plate (21) of the removable case (2), the positioning board (282) being removably fixed to the shock-absorbing base (281) via a bolt (283), and the positioning board (282) being capable of holding either two 2.5" hard drives (284) or one 3.5" hard drive (385);
   a fan seat (29) being a frame crossing over the lateral plates (22), (22') with one downward extending surface formed with air vents (291), the fan seat (29) being open upward and exposing a plurality of holes (292) for receiving a plurality of heat-dissipating fans (293), respectively, such that the heat-dissipating fans (293) having their tops leveled with an upper edge of the anti-shock HD mount (28), and the upper plate (21A) assembled fixing the heat-dissipating fans (293) in the holes (292) in position; and
   elastic fasteners (20) in pairs engaging with the slots (221), (221') or (222), (222') on the lateral plates (22), (22') and to engage with the notches (231) or (241) on the front plate (23) or the back plate (24), such that the elastic fasteners (20) have their retaining ends (201) extending outward from the slots (221), (221') or (222), (222'), allowing a motherboard (26) to be installed in a front portion or rear portion of the removable case (2).

2. The multi-case rack of claim 1, wherein the motherboard (26), a power supply (27), the anti-shock HD mount (28) the fan seat (29) are received in the accommodating space (25) of the removable case (2) and the motherboard (26) carries a CPU (261), an expansion holder (262) and I/O terminals (263).

3. The multi-case rack of claim 2, wherein the removable case (2), after receiving the motherboard (26), is removably inserted into one of the sockets (11) of the rack body (1).

* * * * *